United States Patent
Tsuzuki et al.

(10) Patent No.: US 7,667,269 B2
(45) Date of Patent: Feb. 23, 2010

(54) TRENCH GATE TYPE SEMICONDUCTOR DEVICE

(75) Inventors: Yukio Tsuzuki, Nukata-gun (JP);
Norihito Tokura, Okazaki (JP);
Yoshihiko Ozeki, Nukata-gun (JP);
Kensaku Yamamoto, Chiryu (JP)

(73) Assignee: DENSO CORPORATION, Kariya (JP)

( * ) Notice: Subject to any disclaimer, the term of this patent is extended or adjusted under 35 U.S.C. 154(b) by 486 days.

(21) Appl. No.: 11/398,551

(22) Filed: Apr. 6, 2006

(65) Prior Publication Data
US 2006/0244053 A1 Nov. 2, 2006

(30) Foreign Application Priority Data
Apr. 28, 2005 (JP) .............................. 2005-132220
Jan. 27, 2006 (JP) .............................. 2006-018580

(51) Int. Cl.
*H01L 23/62* (2006.01)
(52) U.S. Cl. ....................... 257/341; 257/330; 257/332; 257/E29.201
(58) Field of Classification Search ................... 257/341
See application file for complete search history.

(56) References Cited

U.S. PATENT DOCUMENTS

| 5,321,289 | A | 6/1994 | Baba et al. |
| 6,060,747 | A * | 5/2000 | Okumura et al. ............ 257/331 |
| 6,482,701 | B1 | 11/2002 | Ishikawa et al. |
| 6,661,053 | B2 | 12/2003 | Willer et al. |
| 6,737,705 | B2 | 5/2004 | Momota et al. |
| 7,061,047 | B2 | 6/2006 | Ono et al. |
| 7,151,297 | B2 * | 12/2006 | Wakimoto et al. .......... 257/330 |
| 2006/0138535 | A1 | 6/2006 | Ono et al. |

OTHER PUBLICATIONS

Office Action dated Mar. 14, 2008 in corresponding Chinese Patent Application No. 200610077712.9 (and English translation).

* cited by examiner

*Primary Examiner*—Kenneth A Parker
*Assistant Examiner*—Jose R Diaz
(74) *Attorney, Agent, or Firm*—Posz Law Group, PLC (57) ABSTRACT

A semiconductor device includes: a first semiconductor layer; a second semiconductor layer on the first semiconductor layer; a third semiconductor layer on the second semiconductor layer; a fourth semiconductor layer in a part of the third semiconductor layer; a trench penetrating the fourth semiconductor layer and the third semiconductor layer and reaching the second semiconductor layer; a gate insulation film on an inner wall of the trench; a gate electrode on the gate insulation film in the trench; a first electrode; and a second electrode. The trench includes a bottom with a curved surface having a curvature radius equal to or smaller than 0.5 μm.

7 Claims, 8 Drawing Sheets

TRENCH GATE TYPE SEMICONDUCTOR DEVICE

CROSS REFERENCE TO RELATED APPLICATIONS

This application is based on Japanese Patent Applications No. 2005-132220 filed on Apr. 28, 2005, and No. 2006-18580 filed on Jan. 27, 2006, the disclosures of which are incorporated herein by reference.

FIELD OF THE INVENTION

The present invention relates to a trench gate type semiconductor device.

BACKGROUND OF THE INVENTION

A trench gate type semiconductor device such as an insulated gate bipolar transistor (i.e., IGBT) and a MOS field effect transistor (i.e., MOSFET) is well known. For example, a trench gate type IGBT is disclosed in U.S. Pat. No. 6,737,705. The IGBT has a cell skipping structure. Specifically, some cell regions are periodically skipped to arrange in the IGBT so that an on-state voltage is reduced. Here, in general IGBT, multiple cell regions are serially arranged in the IGBT. Each cell region functions as an element.

In the IGBT having the cell skipping structure, the thickness of a gate insulation film in a trench is uniform, i.e., homogeneous. Further, a bottom of the trench has a large curvature radius in order to reduce electric field concentration at the bottom of the trench. When a voltage is applied to a collector by a switching operation, the electric field may be concentrated at the bottom of the trench. By increasing the curvature radius of the bottom of the trench, the electric field concentration is prevented or reduced.

Further, it is required for the IGBT to reduce a switching loss when a switch of the IGBT is turned on or when the switch is turned off so that efficiency of a device is improved. Therefore, regarding reduction of switching loss when the switch is turned off, it is considered that a gate resistance is reduced so that a cutoff speed di/dt of current becomes larger. However, when this method is used for the IGBT, the following problems occur. Specifically, when the IGBT is used for switching with large current such as 400 Ampere in order to drive an inductance load, the problems occur.

When the IGBT switches off, a voltage surge is occurred in the voltage waveform, which is different from a general IGBT voltage waveform. Therefore, a collector voltage is increased up to a maximum voltage, which is larger than a power source voltage. After that, the collector voltage is reduced, and becomes constant, which is the same as the power source voltage.

The surge voltage becomes large as the cutoff speed of the current becomes larger. Therefore, in a case where the cutoff voltage of the current in the IGBT becomes large in order to reduce the switching loss when the IGBT switches off, the surge voltage becomes larger. Further, when the surge voltage exceeds a yielding voltage of the device, and when the absorbed energy of the device exceeds a breakdown energy, the device may be damaged.

Here, this breakdown is occurred when the trench gate type IGBT has the cell skipping structure. Further, the breakdown may be occurred when an IGBT has a general construction without having the cell skipping structure. Furthermore, the breakdown may be occurred in a trench gate type MOSFET.

SUMMARY OF THE INVENTION

In view of the above-described problem, it is an object of the present invention to provide a semiconductor device having a small surge voltage.

A semiconductor device includes: a first semiconductor layer having a first conductive type or a second conductive type; a second semiconductor layer having the second conductive type and disposed on a surface of the first semiconductor layer; a third semiconductor layer having the first conductive type and disposed on a surface of the second semiconductor layer; a fourth semiconductor layer having the second conductive type and disposed in a part of a surface portion of the third semiconductor layer; a trench penetrating from the surface of the third semiconductor layer through the fourth semiconductor layer and the third semiconductor layer and reaching the second semiconductor layer; a gate insulation film disposed on an inner wall of the trench; a gate electrode disposed on the gate insulation film in the trench; a first electrode electrically connected to the third semiconductor layer and the fourth semiconductor layer; and a second electrode electrically connected to the first semiconductor layer. The trench includes a bottom having a curved surface, and the curved surface of the bottom of the trench has a curvature radius equal to or smaller than 0.5 μm.

In the above device, an electric field concentration is generated at the bottom of the trench in a positive manner when the IGBT is switched off. Thus, when the IGBT is switched off, a avalanche current flows by means of the electric field concentration at the bottom of the trench, so that a current cutoff speed becomes small. Thus, a surge voltage is reduced so that the device has a small surge voltage when the IGBT is switched off.

Further, a semiconductor device includes: a first semiconductor layer having a first conductive type or a second conductive type; a second semiconductor layer having the second conductive type and disposed on a surface of the first semiconductor layer; a third semiconductor layer having the first conductive type and disposed on a surface of the second semiconductor layer; a fourth semiconductor layer having the second conductive type and disposed in a part of a surface portion of the third semiconductor layer; a trench penetrating from the surface of the third semiconductor layer through the fourth semiconductor layer and the third semiconductor layer and reaching the second semiconductor layer; a gate insulation film disposed on an inner wall of the trench; a gate electrode disposed on the gate insulation film in the trench; a first electrode electrically connected to the third semiconductor layer and the fourth semiconductor layer; and a second electrode electrically connected to the first semiconductor layer. The gate insulation film includes a bottom part and a side part. The bottom part of the gate insulation film is disposed on a bottom of the trench. The side part of the gate insulation film is disposed on a sidewall of the trench. The bottom part of the gate insulation film has a thickness, which is thicker than a thickness of the side part of the gate insulation film.

In the above device, the electric field concentration is generated at the bottom of the trench in a positive manner when the IGBT is switched off. Thus, when the IGBT is switched off, the avalanche current flows by means of the electric field concentration at the bottom of the trench, so that the current cutoff speed becomes small. Thus, the surge voltage is reduced so that the device has a small surge voltage when the IGBT is switched off.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The inventors have preliminarily studied about a trench gate type semiconductor device as a comparison.

Figure 8:
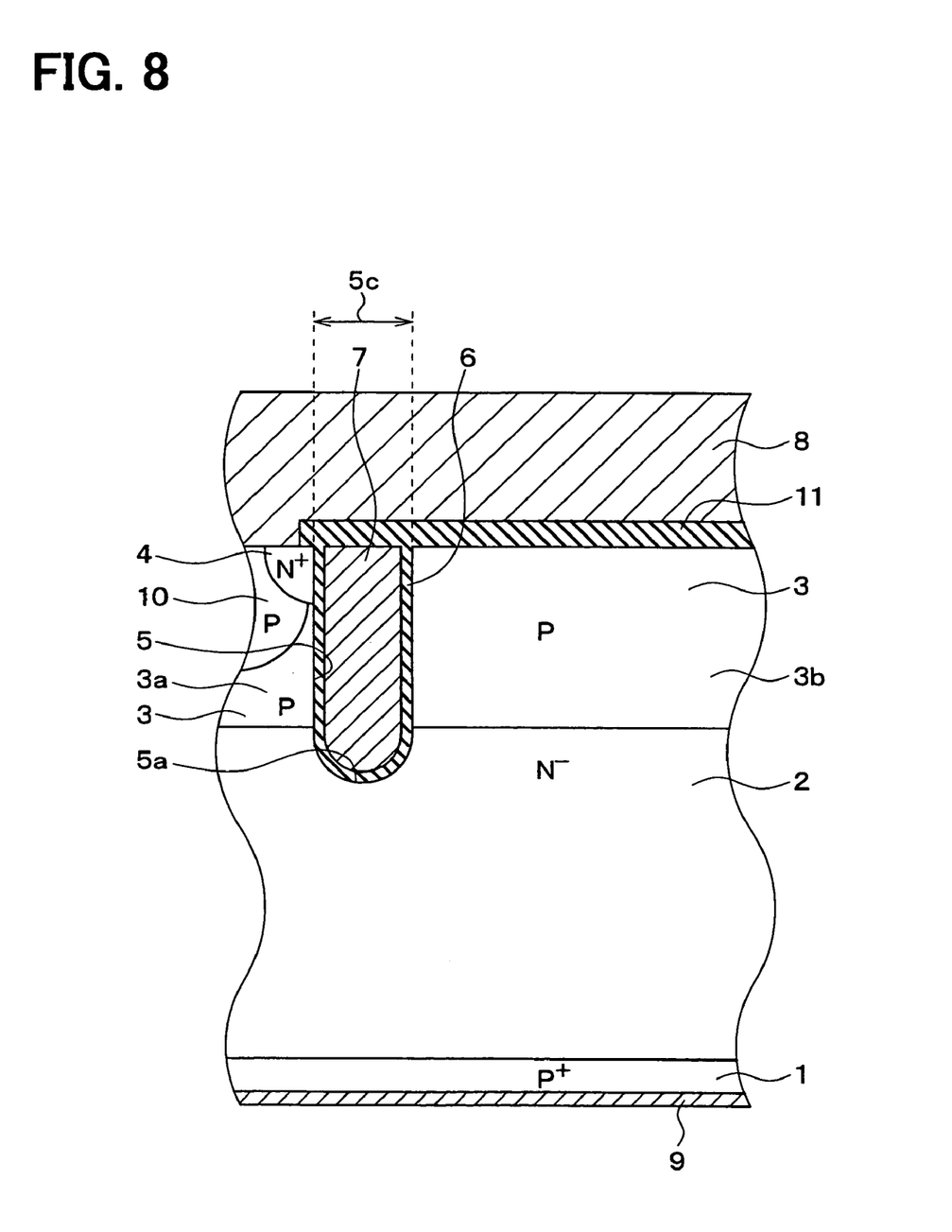
FIG. 8 is a cross sectional view showing a trench gate type IGBT according to a comparison of the first embodiment of the present invention.

A trench gate type IGBT is one example of the trench gate type semiconductor device. The IGBT is shown in FIG. 8. The IGBT has a cell skipping structure. Specifically, some cell regions are periodically skipped to arrange in the IGBT so that an on-state voltage is reduced. Here, in general, multiple cell regions are serially arranged in the IGBT. Each cell region functions as an element.

The IGBT includes a $P^+$ type layer 1, a $N^-$ type drift layer 2, a P type base region 3, a $N^+$ type emitter region 4, a trench 5, a gate insulation film 6, a gate electrode 7, an emitter electrode 8 and a collector electrode 9. The $N^-$ type drift layer 2 is disposed on the surface of the $P^+$ type layer 1. The P type base region 3 is disposed on the surface of the $N^-$ type drift layer 2. The $N^+$ type emitter region 4 is disposed in the P type base region 3, and disposed on a surface side of the P type base region 3. The trench 5 penetrates through the $N^+$ type emitter region 4 and the P type base region 3 from the surface of the base region 3, and reaches the $N^-$ type drift layer 2. The gate insulation film 6 is formed on an inner wall of the trench 5. The gate electrode 7 is formed on the gate insulation film 6, and disposed in the trench 5. The emitter electrode 8 is disposed on the surface of the base region 3. Further, the emitter electrode 8 electrically connects to a part of the base region 3 and the emitter region 4. The collector electrode 9 is disposed on a backside of the $P^+$ type layer 1, and connects to the $P^+$ type layer 1 electrically.

The P type base region 3 includes a first portion 3a and a second portion 3b, which are separated by the trench 5 electrically. The first portion 3a of the P type base region 3 is disposed on a left side of the trench, as shown in FIG. 8. The emitter region 4 and a P type body region 10 are formed only in the first portion 3a. The first portion 3a on the left side is electrically connected to the emitter electrode 8 through the P type body region 10. The emitter region 4 is disposed on a part of a surface portion near the trench 5. A channel is formed in a region of the first portion contacting the trench 5. The first portion 3a represents the above-described cell region.

The second portion of the base region 3 is disposed on the right side of the trench 5. The second portion 2b is electrically isolated from the emitter electrode 8 and other electrodes with an insulation film 11. Thus, the electric potential of the second portion is electrically floated. The second portion 3b represents a portion of skipping the cell region. Specifically, one of cell region is removed from multiple cell regions so that the second portion 3b is formed.

In this IGBT, the thickness of the gate insulation film 6 in the trench 5 is uniform. Further, a bottom of the trench 5 has a large curvature radius in order to reduce electric field concentration at the bottom 5a of the trench 5. When a voltage is applied to a collector by a switching operation, the electric field may be concentrated at the bottom 5a of the trench 5. By increasing the curvature radius of the bottom 5a of the trench 5, the electric field concentration is prevented.

The present inventors have preliminarily studied about the curvature radius. Specifically, when the trench is formed in the base region 3 perpendicularly to the surface of a substrate, a width 5c of the trench 5 is equal to or larger than 1.2 μm, and the curvature radius of the bottom 5a of the trench 5 is dual to or larger than 0.6 μm.

It is required for the IGBT to reduce a switching loss when a switch is turned on or when the switch is turned off so that efficiency of a device is improved. Therefore, regarding reduction of switching loss when the switch is turned off, it is considered that a gate resistance is reduced so that a cutoff speed di/dt of current becomes larger. However, when this method is used for the IGBT, the following problems occur. Specifically, when the IGBT is used for switching with large current such as 400 Ampere in order to drive an inductance load, the problems occur.

Figure 9:
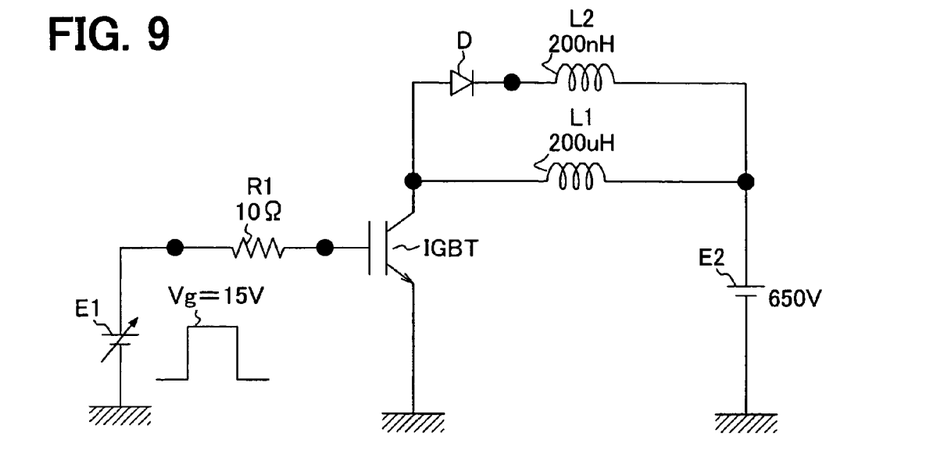
FIG. 9 is a circuit diagram showing an example circuit having the IGBT.

FIG. 9 shows an example circuit for driving an inductance load with an IGBT. A gate resistance R1 and a power source E1 for applying a gate voltage are connected in series between a gate and a ground of the IGBT. An inductance L1 and a voltage power source E2 are connected in series between a collector and the ground of the IGBT. Further, a freewheel diode D and a second inductance L2 for absorbing a surge are connected in parallel with the first inductance L1. Here, the first inductance L1 is a load inductance, and the second inductance L2 is a parasitic inductance of a wiring. The gate resistance R1 has a resistance Rg=10Ω, the voltage Vg of the power source E1 is 15 V, the first inductance L1 is 200 μH, the second inductance L2 is 200 nH, and the voltage of the voltage power source E2 is 650 V.

Figure 10:
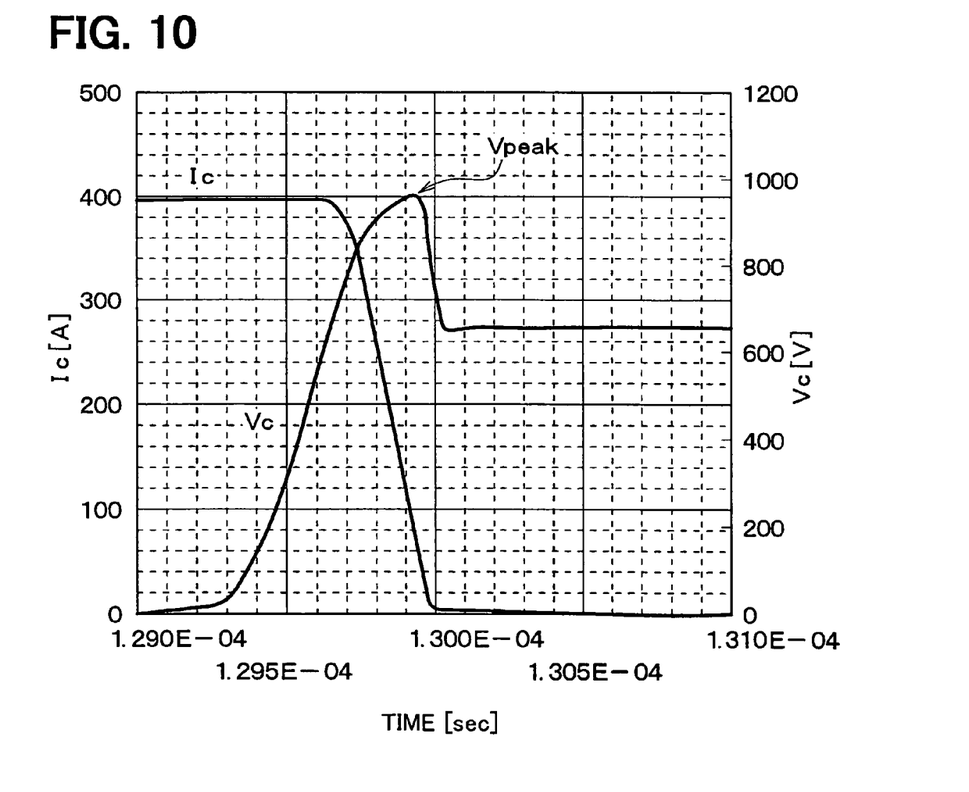
FIG. 10 is a graph showing an operation waveform in case of switching off of the IGBT in FIG. 9.

FIG. 10 shows an operation waveform when the IGBT switches off. FIG. 10 shows a simulation result of the operation waveform when the example circuit has the construction shown in FIG. 9. As shown in FIG. 10, when the IGBT switches off, a voltage surge is occurred in the voltage waveform, which is different from a general IGBT voltage waveform. Therefore, a collector voltage Vc is increased up to a maximum voltage Vpeak, which is larger than the power source voltage. After that, the collector voltage Vc is reduced, and becomes constant, which is the same as the power source voltage.

The reason why the voltage surge is occurred is explained as follows. In the circuit shown in FIG. 9, when the IGBT switches off, the electric energy accumulated in the load inductance L1 is to discharge through the freewheel diode D. Specifically, a collector current Ic changes from 400 Ampere to zero Ampere. However, the parasitic inductance L2 is disposed in the wiring, to which the freewheel diode D is connected. Thus, the voltage surge occurs by means of the parasitic inductance L2. Specifically, the surge voltage is defined as the maximum voltage Vpeak.

The surge voltage Vpeak becomes large as the cutoff speed of the current becomes larger. Therefore, in a case where the cutoff voltage of the current in the IGBT becomes large in order to reduce the switching loss when the IGBT switches off, the surge voltage Vpeak becomes larger. Further, when the surge voltage Vpeak exceeds a yielding voltage of the device, and when the absorbed energy of the device exceeds a breakdown energy, the device may be damaged.

First Embodiment

Figure 1:
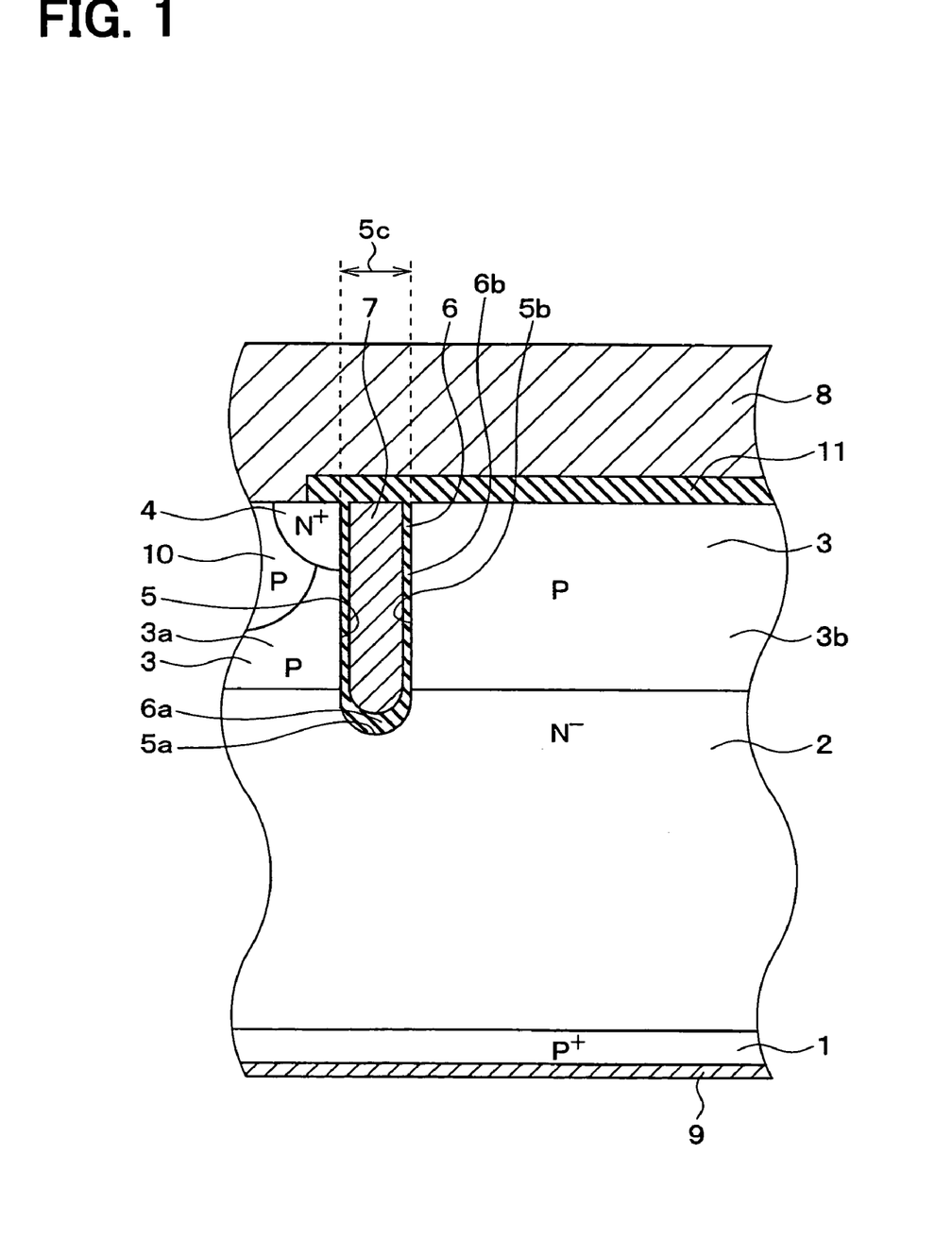
FIG. 1 is a cross sectional view showing a trench gate type IGBT according to a first embodiment of the present invention.

In view of the above points, an IGBT as a semiconductor device according to a first embodiment of the present invention is provided. The IGBT is shown in FIG. 1. The IGBT is used for driving an inductance load. For example, the IGBT is used for switching with large current such as 400 Ampere.

Here, in the IGBT shown in FIG. 1, a P type conductivity represents a first type conductivity, a N type conductivity represents a second type conductivity, a $P^+$ type layer 1 represents a first semiconductor layer, a $N^-$ type drift layer 2 represents a second semiconductor layer, a P type base region 3 represents a third semiconductor layer, a $N^+$ type emitter region 4 represents a fourth semiconductor layer, an emitter electrode 8 represents a first electrode, and a collector electrode 9 represents a second electrode.

The $P^+$ type layer 1 is made of, for example, silicon substrate. A gate insulation film 6 is made of, for example, silicon oxide film (i.e., $SiO_2$ film). Further, the gate electrode 7 is made of, for example, polycrystalline silicon (i.e., poly-Si), in which phosphorous (i.e., P) atom is doped with high concentration so that the resistance of poly-Si becomes lower.

In the IGBT, the trench 5 is formed to be perpendicular to the surface of the $P^+$ type layer 1. The trench 5 has the width 5c of about 1 μm, which is different from that of the IGBT in FIG. 6. The curvature radius of the bottom 5a of the trench 5 is in a range between 0 μm and 0.5 μm.

The curvature radius of the bottom 5a is defined as a curvature radius of the whole shape of the bottom 5a when the whole shape of the bottom 5a is formed by a curved surface. When the shape of the bottom 5a partially includes a curved surface, the curvature radius of the bottom 5a is defined as the minimum curvature radius of a part of the bottom 5a. Further, when the shape of the bottom 5a includes multiple curved surfaces, the curvature radius of the bottom 5a is defined as the minimum curvature radius of a part of the bottom 5a among all curved surfaces. For example, when the bottom 5a of the trench 5 is composed of a planar shape surface and a curved corner, the curvature radius of the bottom 5a of the trench 5 is defined as the curvature radius of the curved corner. Here, the planar shape surface is disposed on a bottom surface of the trench 5, and the corner is disposed on both ends of the bottom surface of the trench 5.

When the IGBT is designed, the curvature radius of the bottom 5a of the trench 5 is determined in view of influence of electric field concentration. This is because the electric field concentration may affect characteristics of the IGBT.

When the curvature radius of the bottom 5a of the trench 5 is equal to or smaller than 0.5 μm, the trench 5 is formed as follows For example, the $P^+$ type layer 1, in which the $N^-$ type drift layer 2 and the P type base region 3 are formed, is etched anisotropically so that the trench 5 has a trench width 5c equal to or smaller than 1 μm. In this case, the curvature radius of the bottom 5a becomes equal to or smaller than 0.5 μm.

In the IGBT, a bottom part 6a of the gate insulation film 6 disposed on the bottom 5a of the trench 5 has the thickness thicker than that of a side part 6b of the gate insulation film 6 disposed on a sidewall 5b of the trench 5.

Preferably, the thickness of the bottom part 6a of the gate insulation film 6 is equal to or more than twice larger than the thickness of the side part 6b. Further, the thickness of the side part 6b uniformly formed on the sidewall 5b of the trench 5.

A part of the gate insulation film 6 contacting a channel region of the P type base region 3 has a uniform thickness. The bottom part 6a of the gate insulation film 6 does not have a uniform thickness. The thickness of a part of the bottom part 6a disposed near the side part 6b is thinner than other parts of the bottom part 6a. Specifically, the part of the bottom part 6a around a bonding portion between the $N^-$ type drift layer 2 and the P type base region 3 is thinner than other parts of the bottom part 6a.

A method for forming the gate insulation film 6, in which the bottom part 6a of the gate insulation film 6 is thicker than the side part 6b of the gate insulation film 6, is described as follows. For example, the crystal surface orientation of the bottom 5a of the trench 5 is selected to have high crystal growth speed of the oxide film, which is higher than that of the crystal surface orientation of the sidewall 5b of the trench 5. Thus, the gate insulation film 6 is deposited on the bottom 5a of the trench 5 with high crystal growth speed, and deposited on the sidewall 5b of the trench 5 with low crystal growth speed. Thus, the thickness of the bottom part 6a of the gate insulation film 6 disposed on the bottom 5a of the trench 5 is thicker than that of the side part 6b of the gate insulation film 6 disposed on the sidewall 5b of the trench 5.

In the IGBT shown in FIG. 8, the curvature radius of the bottom 5a of the trench 5 is equal to or larger than 0.6 μm. However, in the IGBT shown in FIG. 1, the curvature radius of the bottom 5a of the trench 5 is equal to or smaller than 0.5 μm so that the electric field concentration occurs at the bottom 5a of the trench 5 when the device is switched off. Thus, in the IGBT shown in FIG. 1, avalanche breakdown is easily generated, i.e., the IGBT in FIG. 1 is formed in a positive manner to have the construction, in which the avalanche breakdown is easily occurred.

Further, since the thickness of the bottom part 6a of the gate insulation film 6 is thicker than that of the side part 6b, the electric field concentration occurs at the bottom 5a of the trench 5 when the device is switched off. Thus, in the IGBT shown in FIG. 1, avalanche breakdown is easily generated, i.e., the IGBT in FIG. 1 is formed in a positive manner to have the construction, in which the avalanche breakdown is easily occurred.

The reason why the avalanche breakdown is easily generated is explained as follows. The thickness of the bottom part 6a of the gate insulation film 6 is not homogeneous so that the thickness of the part of the bottom part 6a near the side part 6b is thinner than other parts of the gate insulation film 6.

Accordingly, at the other parts of the gate insulation film 6 having large thickness, the electric field is relaxed, i.e., moderated. However, at the part of the gate insulation film 6 having small thickness, the electric field becomes dense. Thus, the electric field is concentrated at the part of the gate insulation film 6 having thin thickness, so that the avalanche breakdown is easily occurred.

Characteristics of the circuit shown in FIG. 9 are explained when the IGBT switches off. When the gate voltage turns off, the collector voltage increases. At the same time, the collector current starts to decrease. In the IGBT shown in FIG. 1, when the collector current increases, the electric field at the bottom 5a of the trench 5 becomes dense. Thus, the avalanche breakdown is easily occurred, so that the avalanche current flows.

The avalanche current flows in addition to the collector current. Accordingly, in the IGBT, the current cutoff speed di/dt becomes smaller, compared with the IGBT shown in FIG. 8 in a case where the switching loss is equalized between two IGBTS in FIG. 1 and FIG. 8.

Thus, the increase of the collector voltage is determined on the basis of the magnitude of the current cutoff speed di/dt and the parasitic inductance L2 of the wiring. Therefore, the increase of the collector voltage in the IGBT shown in FIG. 1 is suppressed, compared with the IGBT shown in FIG. 8, so that the surge voltage Vpeak becomes smaller.

Accordingly, in the IGBT used for the circuit shown in FIG. 9, the gate resistance is decreased, so that breakdown is prevented from generating even when the energy loss is small.

Figure 2:
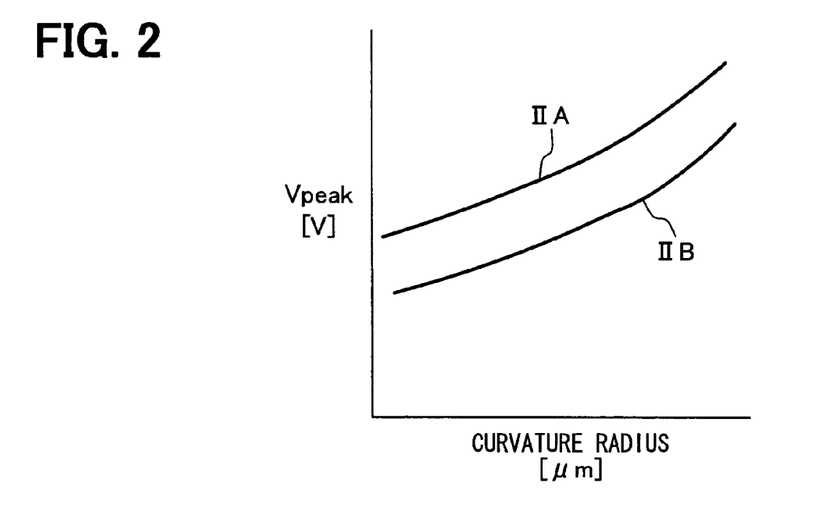
FIG. 2 is a graph showing a relationship between a surge voltage Vpeak and a curvature radius of a bottom of a trench in the IGBT according to the first embodiment.

FIG. 2 shows a relationship between the surge voltage Vpeak and the curvature radius of the bottom 5a of the trench 5. IIA represents a case where the thickness of the gate insulation film 6 becomes homogeneous, and IIB represents a case where the bottom part 6a of the gate insulation film 6 is thicker than that of the side part 6b of the trench 6.

When the curvature radius of the bottom 5a of the trench 5 is equal to or smaller than 0.5 µm, as the curvature radius becomes smaller, the surge voltage Vpeak becomes smaller in a case where the thickness of the gate insulation film 6 is homogeneous, which is shown as the case IIA in FIG. 2. Further, as the curvature radius becomes smaller, the surge voltage Vpeak becomes smaller in a case where the bottom part 6a of the gate insulation film 6 is thicker than that of the side part 6b of the trench 6, which is shown as the case IIB in FIG. 2.

As described later, the IGBT shown in FIG. 1 has small energy loss when the IGBT turns on, i.e., switches on.

Although the IGBT in FIG. 1 has a construction such that the curvature radius of the bottom 5a of the trench 5 is equal to or smaller than 0.5 µm and another construction such that the bottom part 6a of the gate insulation film 6 is thicker than that of the side part 6b, alternatively, the IGBT may have at least one of two constructions. As described below, even when the IGBT has only one of two constructions, the IGBT has small surge voltage.

The following examples represent the dimensions of the IGBT and operation voltage of the IGBT shown in FIG. 1. Further, a comparison example is also described later.

EXAMPLE NO. 1

The curvature radius of the bottom 5a of the trench 5 is 0.5 µm. The thickness of the bottom part 6a of the gate insulation film 6 is $$2\frac{1}{2}$$

times larger than that of the side part 6b. Specifically, the thickness of the bottom part 6a of the gate insulation film 6 is 250 nm, and the thickness of the side part 6b of the gate insulation film 6 is 100 nm. The trench width 5c of the trench 5 is 0.8 µm, and a trench depth of the trench 5 is 5.0 µm. The thickness of the P$^+$ type layer 1 is 145 µm. The threshold voltage is 6.4 Volts.

EXAMPLE NO. 2

The curvature radius of the bottom 5a of the trench 5 is 0.5 µm. The thickness of the gate insulation film 6 is homogeneous. Specifically, the thickness of the gate insulation film 6 is 100 nm. The trench width 5c of the trench 5 is 0.8 µm, and a trench depth of the trench 5 is 5.0 µm. The thickness of the P$^+$ type layer 1 is 145 µm. The threshold voltage is 6.4 Volts.

EXAMPLE NO. 3

The curvature radius of the bottom 5a of the trench 5 is 0.7 µm. The thickness of the bottom part 6a of the gate insulation film 6 is $$2\frac{1}{2}$$

times larger than that of the side part 6b. Specifically, the thickness of the bottom part 6a of the gate insulation film 6 is 250 nm, and the thickness of the side part 6b of the gate insulation film 6 is 100 nm. The trench width 5c of the trench 5 is 1.2 µm, and a trench depth of the trench 5 is 5.4 µm. The thickness of the P$^+$ type layer 1 is 145 µm. The threshold voltage is 6.4 Volts.

COMPARISON EXAMPLE

The curvature radius of the bottom 5a of the trench 5 is 0.7 µm. The thickness of the gate insulation film 6 is homogeneous. Specifically, the thickness of the gate insulation film 6 is 100 nm. The trench width 5c of the trench 5 is 1.2 µm, and a trench depth of the trench 5 is 5.4 µm. The thickness of the P$^+$ type layer 1 is 145 µm. The threshold voltage is 6.4 Volts.

Figure 3:
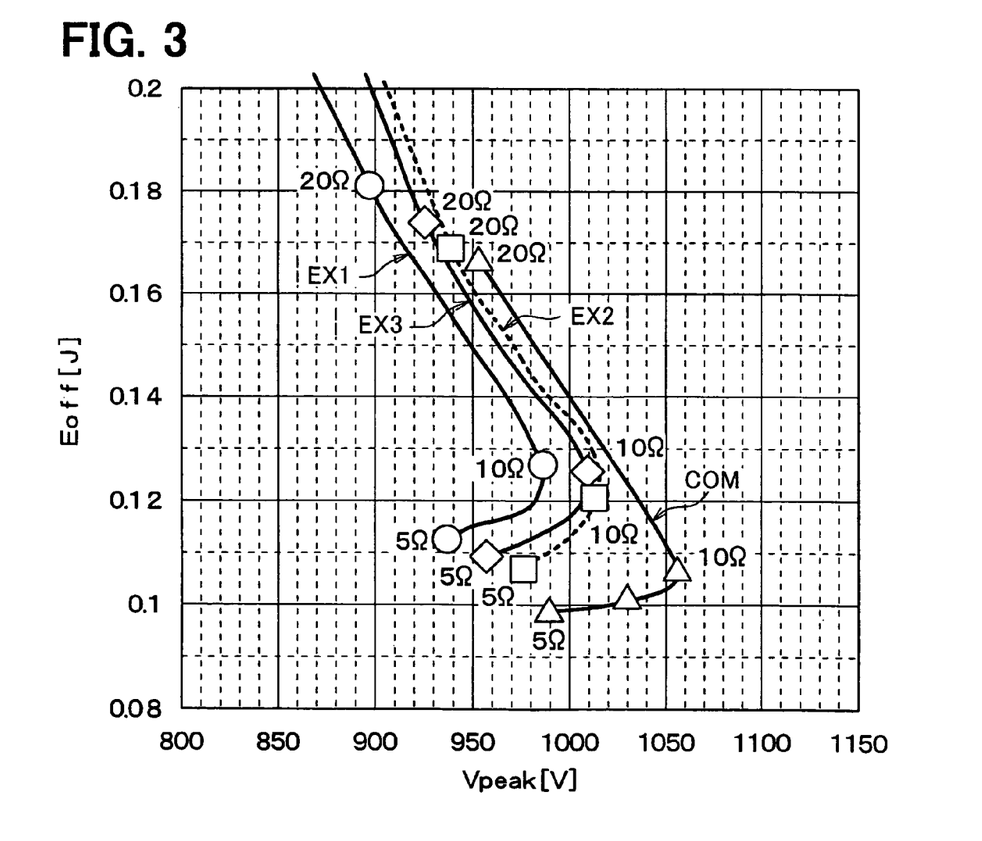
FIG. 3 is a graph showing a relationship between an energy loss Eoff in case of switching off and the surge voltage Vpeak in the IGBT according to the first embodiment.
Figure 4:
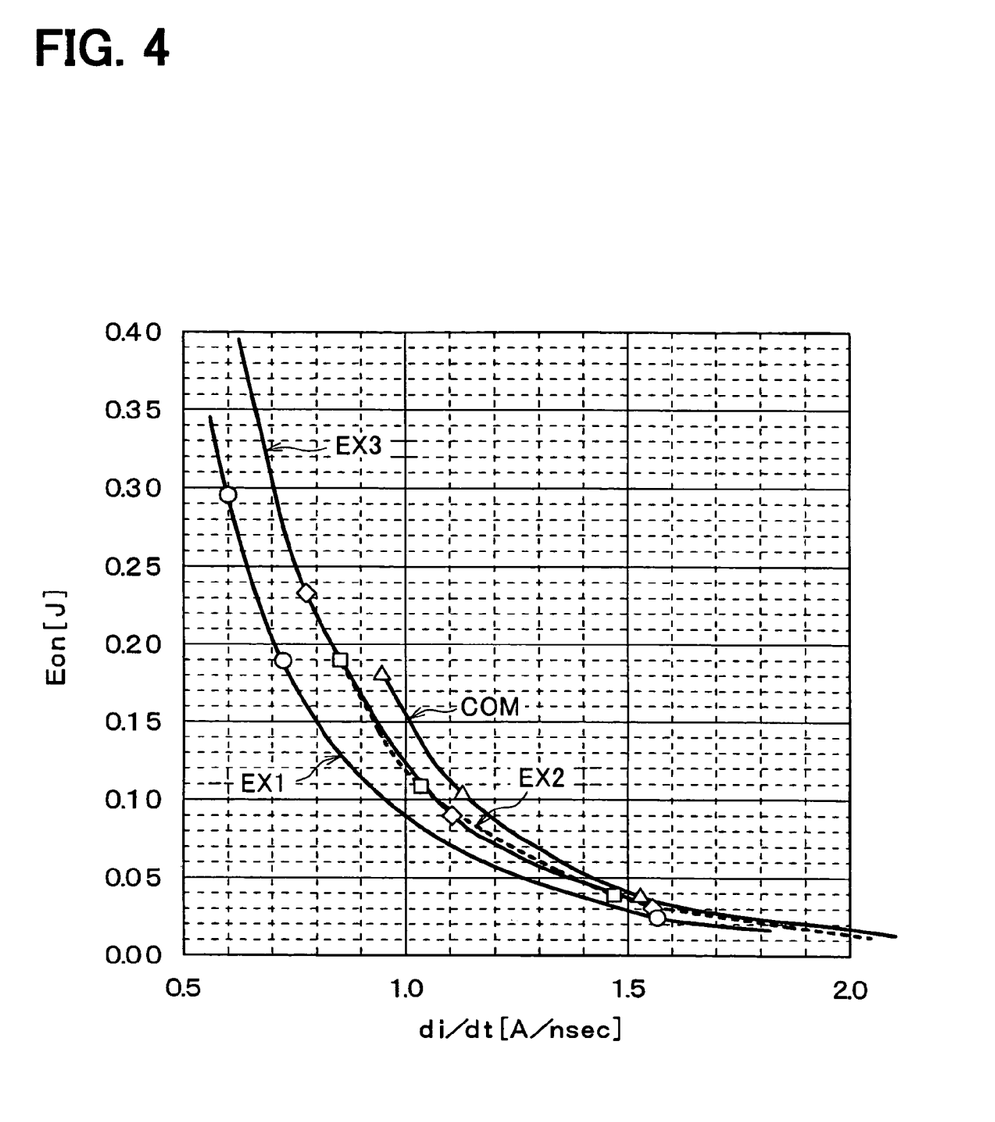
FIG. 4 is a graph showing a relationship between an energy loss Eon in case of switching on and a current cutoff speed di/dt in the IGBT according to the first embodiment.

FIGS. 3 and 4 show simulation results of the examples No. 1 to No. 3 and the comparison example when the circuit in FIG. 9 is a simulation model. In FIGS. 3 and 4, EX. 1 represents the example No. 1, EX. 2 represents the example No. 2, EX. 3 represents the example No. 3, and COM represents the comparison example. Measurement conditions in FIGS. 3 and 4 are the same as conditions in FIG. 10.

FIG. 3 shows a relationship between the energy loss Eoff when the IGBT switches off and the surge voltage Vpeak. In each of the examples No. 1 to No. 3 and the comparison example, the gate resistance R1 is changed from 5 Ω to 20 Ω. The surge voltage Vpeak in each example is calculated when the gate resistance is changed from 5 Ω to 20 Ω.

In each of the examples No. 1 to No. 3 and the comparison example, as the gate resistance R1 becomes smaller, the energy loss Eoff in case of switching off becomes smaller. When the energy loss Eoff is constant, the surge voltage Vpeak in each of the examples No. 1 to No. 3 is smaller than that in the comparison example. Specifically, when the energy loss Eoff is a certain constant value, the surge voltage Vpeak in the example No. 1 is the smallest of all surge voltages Vpeak in the examples No. 1 to No. 3 and the comparison example.

FIG. 4 shows a relationship between the energy loss Eon when the IGBT switches on and the current cutoff speed di/dt.

When the current cutoff speed di/dt is constant, the energy loss Eon in each of the examples No. 1 to No. 3 is smaller than that in the comparison example. Specifically, when the current cutoff speed di/dt is a certain constant value, the energy loss Eon in the example No. 1 is the smallest of all energy losses Eon in the examples No. 1 to No. 3 and the comparison example.

Second Embodiment

Figure 5:
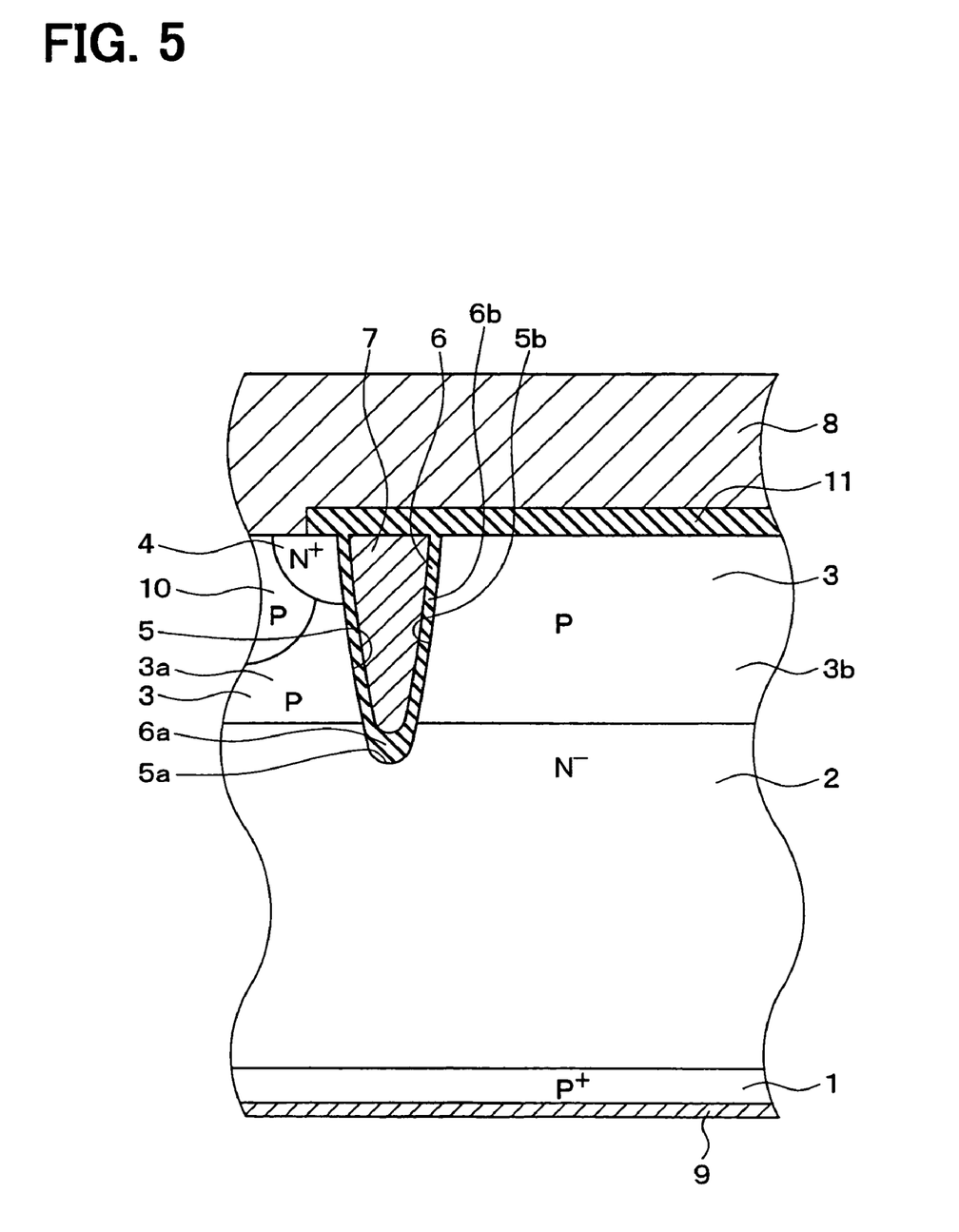
FIG. 5 is a cross sectional view showing a trench gate type IGBT according to a second embodiment of the present invention.

FIG. 5 shows an IGBT according to a second embodiment of the present invention. In the IGBT according to the first embodiment, the sidewall 5b of the trench 5 is perpendicular to the surface of the P$^+$ type layer 1. In the IGBT according to the second embodiment, the sidewall 5b of the trench 5 is slanted off the surface of the P$^+$ type layer 1. Thus, the shape of the trench 5 is a tapered shape. Specifically, as it goes to the bottom 5a of the trench 5, the trench width 5c is gradually reduced.

In this case, the curvature radius of the bottom 5a of the trench 5 becomes equal to or smaller than 0.5 µm. When the shape of the cross section of the trench 5 is tapered shape, the angle between the sidewall 5b of the trench 5 and the surface of the P$^+$ type layer 1 is defined as a tapered angle. The curvature radius of the bottom 5a of the trench 5 is determined in view of the tapered angle. Accordingly, the tapered angle of the trench 5 is designed in such a manner that the curvature radius of the bottom 5a becomes equal to or smaller than 0.5 µm.

The forming method of the trench 5 is, for example, RIE method (i.e., reactive ion etching method). In this case, when the etching conditions such as a type of gas, pressure of the gas, and an input power are controlled appropriately, the shape of the trench 5 can be controlled to have a predetermined tapered shape.

(Modifications)

Although the trench gate type IGBT has the cell skipping structure, the IGBT may have a serial cell structure. Here, the serial cell structure is such that multiple cells are arranged serially in the IGBT without skipping the cell periodically. Specifically, the N$^+$ type emitter region 4 is formed on the right side of the trench 5, i.e., the emitter region 4 is disposed in the second portion 3b of the P type base region 3. The second portion 3b and the emitter region 4 are electrically connected to the emitter electrode 8. In this general IGBT, when the general IGBT is used for the circuit shown in FIG. 9, the surge voltage in case of switching off can be reduced. However, only in the IGBT having the cell skipping structure, the energy loss in case of switching on is reduced.

Figure 6A:
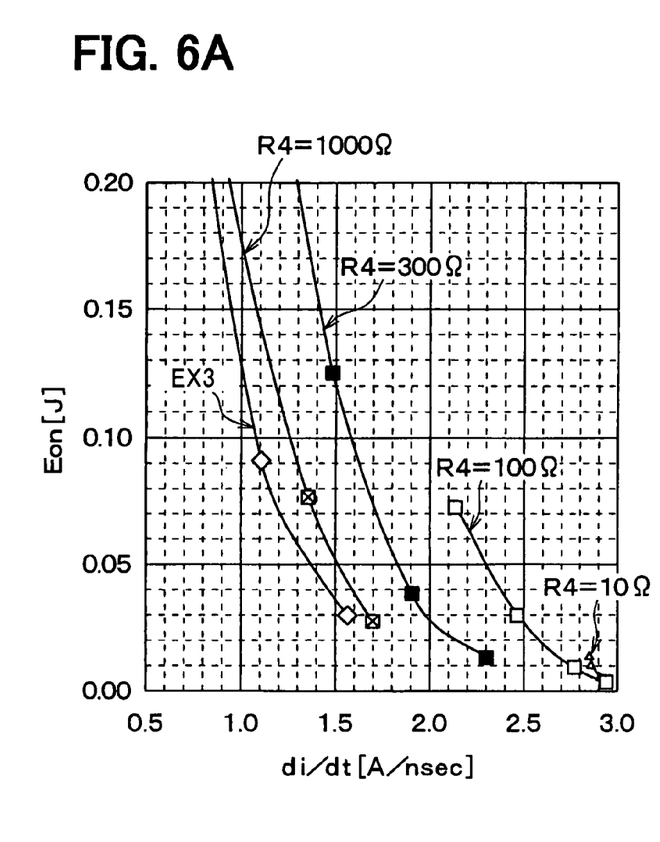
FIG. 6A is a graph showing a relationship between the energy loss Eon in case of switching on and the current cutoff speed di/dt in an IGBT obtained by a simulation model.
Figure 6B:
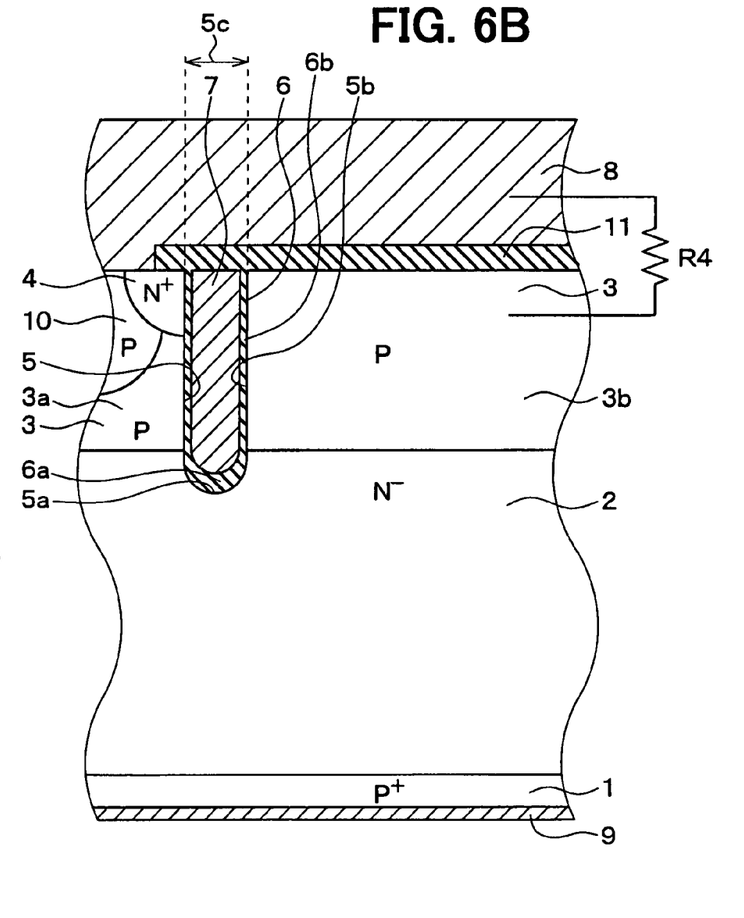
FIG. 6B is a cross sectional view showing an IGBT as the simulation model.

FIG. 6A shows a relationship between the current cutoff speed di/dt and the energy loss Eon in case of switching on, which is obtained by a simulation results. Specifically, a relationship between insulating property between the first portion 3a and the second portion 3b, which are divided by the trench 5 electrically, and the energy loss Eon is shown in FIG. 6A. FIG. 6B shows a simulation model of the IGBT. The insulating property is defined as a resistance R4, which is disposed between the second portion 3b of the base region 3 and the emitter electrode 8. Ex. 3 represents the above described example No. 3.

When the current cutoff speed di/dt is constant, as the resistance R4 becomes smaller, the energy loss Eon in case of switching on becomes larger. Thus, only in the IGBT having the cell skipping structure, the energy loss Eon in case of switching on is reduced.

Alternatively, the IGBT may have a N type layer having a high impurity concentration higher than that of the N$^-$ type drift layer 2. The N type layer is disposed between the P$^+$ type layer 1 and the N$^-$ type drift layer 2. In this case, the IGBT has the same effects as the first embodiment. Specifically, in the IGBT, the surge voltage Vpeak in case of switching off is reduced, and the energy loss Eon in case of switching on is reduced.

Figure 7:
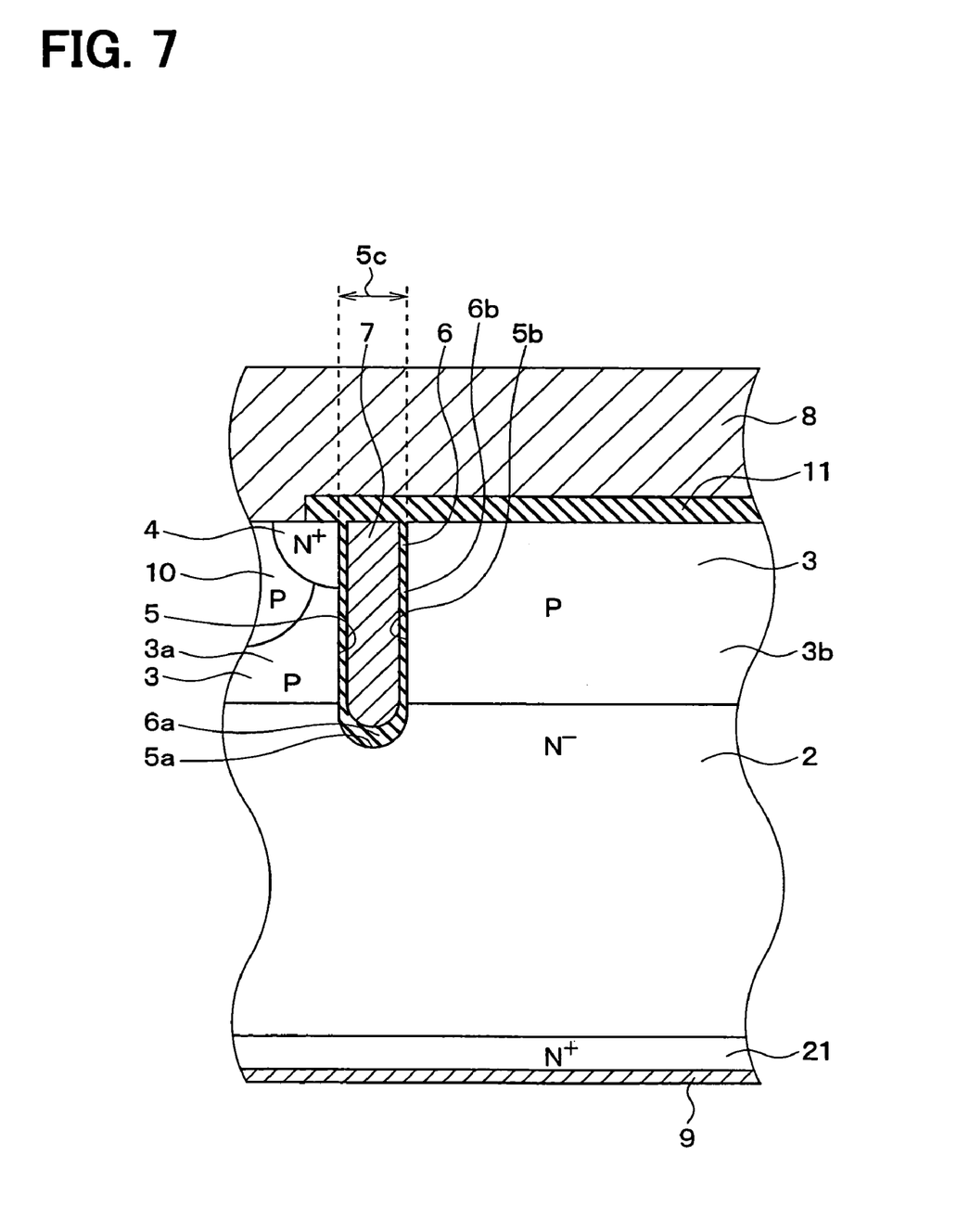
FIG. 7 is a cross sectional view showing a trench gate type MOSFET according to a modification of the first embodiment of the present invention.

Although the semiconductor device is the IGBT, the semiconductor device may have another structure. For example, the semiconductor device may have a construction shown in FIG. 7. In this case, the device is a MOSFET. The MOSFET includes a N$^+$ type layer 21 instead of the P$^+$ type layer 1 in the IGBT shown in FIG. 1. Further, the MOSFET may have a N$^+$ type layer instead of a P$^+$ type layer in the IGBT (not shown). Thus, when the semiconductor device is a trench gate type device, the surge voltage Vpeak in case of switching off is reduced, and the energy loss Eon In case of switching on is reduced.

Although the first conductive type is the P type and the second conductive type is the N type, the first conductive type may be the N type and the second conductive type may be the P type. In this case, the conductive type in each part of the semiconductor device is reversed.

The present invention has the following aspects.

A semiconductor device includes: a first semiconductor layer having a first conductive type or a second conductive type; a second semiconductor layer having the second conductive type and disposed on a surface of the first semiconductor layer; a third semiconductor layer having the first conductive type and disposed on a surface of the second semiconductor layer; a fourth semiconductor layer having the second conductive type and disposed in a part of a surface portion of the third semiconductor layer; a trench penetrating from the surface of the third semiconductor layer through the fourth semiconductor layer and the third semiconductor layer and reaching the second semiconductor layer; a gate insulation film disposed on an inner wall of the trench; a gate electrode disposed on the gate insulation film in the trench; a first electrode electrically connected to the third semiconductor layer and the fourth semiconductor layer; and a second electrode electrically connected to the first semiconductor layer. The trench includes a bottom having a curved surface, and the curved surface of the bottom of the trench has a curvature radius equal to or smaller than 0.5 µm.

In the above device, an electric field concentration is generated at the bottom of the trench in a positive manner when the IGBT is switched off. Thus, when the IGBT is switched off, a avalanche current flows by means of the electric field concentration at the bottom of the trench, so that a current cutoff speed becomes small. Thus, a surge voltage is reduced so that the device has a small surge voltage when the IGBT is switched off.

Alternatively, the gate insulation film may include a bottom part and a side part. The bottom part of the gate insulation film is disposed on the bottom of the trench. The side part of the gate insulation film is disposed on a sidewall of the trench. The bottom part of the gate insulation film has a thickness, which is thicker than a thickness of the side part of the gate insulation film. In this case, the electric field concentration is much generated at the bottom of the trench in a positive manner when the IGBT is switched off. Thus, the surge voltage is much reduced so that the device has a small surge voltage when the IGBT is switched off.

Further, the thickness of the bottom part of the gate insulation film may be equal to or more than twice thicker than that of the side part of the gate insulation film. Further, the trench may be perpendicular to the surface of the third semiconductor layer. Or, the trench may be slanted off the surface of the third semiconductor layer so that the trench has a tapered shape.

Alternatively, the third semiconductor layer may include a first portion and a second portion, which are electrically separated by the trench. The first portion of the third semiconductor layer is electrically connected to the first electrode, and the second portion of the third semiconductor layer is electrically disconnected to the first electrode. In this case, energy loss is reduced when the IGBT turns on. Thus, the device has a small energy loss when the IGBT is switched on. Further, the first semiconductor layer has the first conductive type. The device provides an insulated gate bipolar transistor having a cell skipping structure, and the second portion of the third semiconductor layer provides the cell skipping structure. Further, the first semiconductor layer has the second conductive type, and the device provides a metal oxide semiconductor field effect transistor.

Further, a semiconductor device includes: a first semiconductor layer having a first conductive type or a second conductive type; a second semiconductor layer having the second conductive type and disposed on a surface of the first semiconductor layer; a third semiconductor layer having the first conductive type and disposed on a surface of the second semiconductor layer; a fourth semiconductor layer having the second conductive type and disposed in a part of a surface portion of the third semiconductor layer; a trench penetrating from the surface of the third semiconductor layer through the fourth semiconductor layer and the third semiconductor layer and reaching the second semiconductor layer; a gate insulation film disposed on an inner wall of the trench; a gate electrode disposed on the gate insulation film in the trench; a first electrode electrically connected to the third semiconductor layer and the fourth semiconductor layer; and a second electrode electrically connected to the first semiconductor layer. The gate insulation film includes a bottom part and a side part. The bottom part of the gate insulation film is disposed on a bottom of the trench. The side part of the gate insulation film is disposed on a sidewall of the trench. The bottom part of the gate insulation film has a thickness, which is thicker than a thickness of the side part of the gate insulation film.

In the above device, the electric field concentration is generated at the bottom of the trench in a positive manner when the IGBT is switched off. Thus, when the IGBT is switched off, the avalanche current flows by means of the electric field concentration at the bottom of the trench, so that the current cutoff speed becomes small. Thus, the surge voltage is reduced so that the device has a small surge voltage when the IGBT is switched off.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A trench gate type semiconductor device comprising:
   a first semiconductor layer having a first conductive type or a second conductive type;
   a second semiconductor layer having the second conductive type and disposed on a surface of the first semiconductor layer;
   a third semiconductor layer having the first conductive type and disposed on a surface of the second semiconductor layer;
   a fourth semiconductor layer having the second conductive type and disposed in a part of a surface portion of the third semiconductor layer;
   a trench penetrating from the surface of the third semiconductor layer through the fourth semiconductor layer and the third semiconductor layer and reaching the second semiconductor layer;
   a gate insulation film disposed on an inner wall of the trench;
   a gate electrode disposed on the gate insulation film in the trench;
   a first electrode electrically connected to the third semiconductor layer and the fourth semiconductor layer; and
   a second electrode electrically connected to the first semiconductor layer, wherein
   the trench includes a bottom having a curved surface,
   the curved surface of the bottom of the trench has a curvature radius equal to or smaller than 0.5 µm,
   the gate insulation film includes a bottom part and a side part,
   the bottom part of the gate insulation film is disposed on the bottom of the trench,
   the side part of the gate insulation film is disposed on a sidewall of the trench,
   the bottom part of the gate insulation film has a thickness, which is thicker than a thickness of the side part of the gate insulation film,
   the third semiconductor layer includes a first portion and a second portion, which are electrically separated by the trench,
   the first portion of the third semiconductor layer is electrically connected to the first electrode, and
   the second portion of the third semiconductor layer is electrically disconnected to the first electrode.

2. The device according to claim 1, wherein
the thickness of the bottom part of the gate insulation film is equal to or more than twice thicker than that of the side part of the gate insulation film.

3. The device according to claim 2, wherein
the trench is perpendicular to the surface of the third semiconductor layer.

4. The device according to claim 2, wherein
the trench is slanted off the surface of the third semiconductor layer so that the trench has a tapered shape.

5. The device according to claim 1, wherein
the first semiconductor layer has the first conductive type,
the device provides an insulated gate bipolar transistor having a cell skipping structure, and
the second portion of the third semiconductor layer provides the cell skipping structure.

6. The device according to claim 1, wherein
the first semiconductor layer has the second conductive type, and
the device provides a metal oxide semiconductor field effect transistor.

7. The device according to claim 6, wherein
the metal oxide semiconductor field effect transistor has a cell skipping structure, and
the second portion of the third semiconductor layer provides the cell skipping structure.

* * * * *